(12) United States Patent
Maschek

(10) Patent No.: US 6,242,911 B1
(45) Date of Patent: Jun. 5, 2001

(54) FIELD SENSOR AND DEVICE AND PROCESS FOR MEASURING ELECTRIC AND/OR MAGNETIC FIELDS

(76) Inventor: Hubertus Maschek, Theodor-Heuss-Strasse 3, D-86976 Kaufering (DE)

(*) Notice: Subject to any disclaimer, the term of this patent is extended or adjusted under 35 U.S.C. 154(b) by 0 days.

(21) Appl. No.: 09/142,352

(22) PCT Filed: Mar. 21, 1997

(86) PCT No.: PCT/EP97/01453

§ 371 Date: Nov. 30, 1998

§ 102(e) Date: Nov. 30, 1998

(87) PCT Pub. No.: WO97/37233

PCT Pub. Date: Oct. 9, 1997

(30) Foreign Application Priority Data

Mar. 29, 1996 (DE) .............................. 196 12 777
Nov. 19, 1996 (DE) .............................. 196 47 830

(51) Int. Cl.$^7$ ............................. G01R 29/08; G01R 33/02
(52) U.S. Cl. ............................. 324/247; 324/72; 324/95; 324/658
(58) Field of Search ................... 324/260, 247, 324/76.14, 96, 658, 95, 72

(56) References Cited

U.S. PATENT DOCUMENTS

| | | | |
|---|---|---|---|
| 3,794,914 | * 2/1974 | Aslan | 324/95 |
| 4,023,093 | 5/1977 | Aslan | 324/43 R |
| 4,588,993 | 5/1986 | Babij et al. | 343/351 |
| 5,300,885 | 4/1994 | Bull | 324/247 |
| 5,646,525 | * 7/1997 | Gilboa | 324/207.17 |

FOREIGN PATENT DOCUMENTS

| | | |
|---|---|---|
| 1-3308717 | 9/1984 | (DE) . |
| 1-3822369 | 6/1989 | (DE) . |
| 1-3843087 | 6/1989 | (DE) . |
| 1-4307453 | 9/1994 | (DE) . |
| 1-4428336 | 12/1994 | (DE) . |
| 1-4432886 | 3/1996 | (DE) . |
| 2 146 128 | * 4/1985 | (GB) . |

OTHER PUBLICATIONS von J. Koch, 901228 Technische Informationen, pp. 1–14 (Jul. 25, 1994).
D. Tandler, NTZ, Nachrichtentechnische Zeitschrift, vol. 48, No. 12, pp. 26–28 (Dec. 01, 1995).
JI. Polivka, Electronics World and Wireless World, vol. 100, No. 1695, p. 148 (Feb. 01, 1994).
Alasdair Philips, Electronics World and Wireless World, vol. 97, No. 1673, pp. 281–283 (Apr. 01, 1992).
L. Puranen et al, Ieee Transactions on Instrumentation and Measurement, vol. 42, No. 6, pp. 1001–1008 (Dec. 01, 1993).
S. Chauzy, Revue Generale de 1 Electricite, No. 7, pp. 27–38 (Jul. 1988).
H. Hirsch, Technisches Messen Tm 1982–1988 Incomplete, vol. 57, No. 12, pp. 473–477 (Dec. 01, 1990).
J. Ramirez–Nino et al, Measurement Science and Technology, vol. 5, No. 12, pp. 1436–1442 (Dec. 01, 1994).
Peter Winterling/MK, Funkschau, pp. 62–66 (Sep. 1996).

* cited by examiner

Primary Examiner—Jay Patidar
Assistant Examiner—Henry S. Andersen
(74) Attorney, Agent, or Firm—Birch, Stewart, Kolasch & Birch, LLP

(57) ABSTRACT

A field sensor (1) comprising means for measuring a magnetic field and an electric field, wherein at least six capacitor plates (5, 6, 7, 15, 16, 17, 25, 26, 27, 35, 36, 37) are provided which are arranged in a cube and in that in the space thus formed the means for measuring the magnetic field is provided, which means is three-dimensionally aligned and for example consists of coils (2, 3, 4), Hall-effect sensors, magnetoresistors or the like.

42 Claims, 2 Drawing Sheets

FIELD SENSOR AND DEVICE AND PROCESS FOR MEASURING ELECTRIC AND/OR MAGNETIC FIELDS

This application is the national phase under 35 U.S.C. §371 of prior PCT International Application No. PCT/EP97/0153 which has an International filing date of Mar. 21, 1997 which designated the United States of America, the entire contents of which are hereby incorporated by reference.

FIELD OF THE INVENTION

The present invention relates to a field sensor comprising means for measuring a magnetic field and/or an electric field as well as a corresponding method.

BRIEF SUMMARY OF THE INVENTION

The object of the present invention is based on the object of providing a field sensor of the aforementioned type with which electric or magnetic fields may be measured simultaneously or successively in any direction, and a respective device as well as a corresponding method.

A field sensor is provided with at least six capacitor plates which are arranged in a cube and in the space thus formed a means for measuring the magnetic field is provided which means is three-dimensionally aligned and consists for example of coils, Hall-effect sensors, magnetoresistors or the like.

The capacitor plates serve in this connection for measuring the electric field three-dimensionally and simultaneously generate in the interior of their spatial arrangement a field-free space. The latter is provided with the measuring means which enables a three-dimensional detection of the magnetic field without interference by the electric field.

Thus, an electric and a magnetic field can simultaneously be measured three-dimensionally, however, without affecting each other.

In an advantageous embodiment of the invention, three annular and/or cylindrical coils are provided which are arranged on the x-, y- or z-axis and the coils are surrounded by the capacitor plates every two of which are arranged in parallel to each other.

According to an alternative embodiment, the capacitor plates are partially or completely arranged within a space which is formed by the components of a magnetometer. In a magnetometer consisting of coils, e.g., the coils extend partially or completely beyond the capacitor plates. The size of the capacitor plates and their distance from each other is selected as a function of the size of the magnetometer components such that an electric and a magnetic field may simultaneously be measured three-dimensionally, their mutual interference being preferably low. Preferably, the edge length of the capacitor plates is low with respect to the outer dimensions of the magnetometer components. The ratio between the edge length of the capacitor plates and for example the diameter of a magnetic field coil is in the range of 1 to 100 up to 100 to 1. The capacitor plates may be displaced up to 30% of the coil diameter to the inside.

In other words, in the alternative embodiments, the space formed by the capacitor plates and the space formed by the means for measuring the magnetic field are aligned with each other and both systems intersect with each other three-dimensionally while having a common reference point.

In a further preferred embodiment of the invention, the coils are fitted into each other annularly with an almost identical diameter.

Thus, the magnetic field may uniformly be measured in all three directions.

It has also turned out to be quite advantageous if, according to a further embodiment of the invention, each coil has a couple of capacitor plates which are provided in parallel to the respective coil outside the coil arrangement.

Thus, the coils are perfectly screened by the capacitor plates.

According to an embodiment of the invention it is also very advantageous to provide the capacitor plates with a high-resistance coating.

It is, however, also possible according to a further embodiment of the invention that the capacitor plates consist of a high-resistance material.

In both embodiments, any interference with the magnetic field to be measured is excluded.

A further embodiment of the invention is characterized in that the capacitor plates are arranged in couples and each of the respective inner plates is electronically connected to a common earth terminal.

Thus, any interference of the coils, Hall-effect sensors or magnetoresistors with the electric field is excluded.

According to a further embodiment of the invention, it has turned out to be very advantageous to provide the electric terminals of the capacitor plates at their edge. Thus, any influence of the current within the lines on the measuring result is avoided.

The present invention further relates to a device for measuring electric fields which comprises a field sensor with at least one capacitor-plate couple whose output voltage is applied to the non-inverting and the inverting input of a differential amplifier, a capacitor being connected between the two inputs of the differential amplifier. This measuring device may in particular be used with the field sensor described above. The measuring device works on the following basic principle. An arrangement of two capacitor plates leads to a voltage drop in the electric field at the capacitor; this voltage drop is decoupled by earthing via a differential amplifier preferably with a high resistance and preferably with a low input capacity. The relatively high current through the capacitor minimizes the coupling of interference voltages by the measuring amplifier as well as the field intensity between the capacitor plates. The measuring device may preferably be used for measuring electric and/or magnetic fields with a frequency of 1 Hz to 30 GHz, particularly preferred are 5 Hz to 400 kHz. The measuring device is in particular advantageous in that it may be designed as a hand tool which takes measurements both as a stationary tool and when moved with electrically conducting lines and the resulting measuring errors are minimized.

A further preferred feature is the use of thin wires as connections between the measuring device and the capacitor-plate couple. The advantage thereof is that on account of the small cross-section of the wires the interference with the field is low as compared with the plate size of the capacitor-plate couple. Preferably, two wires each are twisted for being connected with one capacitor-plate couple. Thus, magnetic fields generated within the wires on account of a current counterbalance each other such that the resulting magnetic field is kept low and a reverse effect is reduced.

Preferably, the distance between the field plates and the measuring amplifier is so large that the interference of the measuring device with the electric field to be measured is low.

It is particularly preferred that the area of the capacitor and the differential amplifier is small as compared with the area of the capacitor plates in order to further avoid the interference of the measuring device with the electric field to be measured. The method according to the present invention for measuring electric and/or magnetic fields is preferably carried out with a combination of the above-described field sensor and the respective measuring device. In particular, measuring errors caused by the person taking the measurement or the electric lines can be kept within tolerable limits with the present method depending on the measurement set-up. This is in particular achieved by measuring the electric and the magnetic field simultaneously at one point. Moreover, the smallest possible sensors are used to avoid errors on account of field inhomogeneities.

Furthermore, the smallest possible sensors have the advantage that averaging is avoided when measuring an electric or magnetic field. Moreover, the object to be measured may be appreciated.

In particular by using sensitive sensors, the present invention fulfils the electromagnetic compalitrility (EMC) standards.

A simultaneous three-dimensional measurement of electric and magnetic fields moreover avoids possible measuring errors which may occur in one-dimensional measurements when searching the maximum field.

On account of a larger distance between the person taking the measurement and the measuring device as well as technical measures at the measuring device for providing a high-resistance set-up as well as a small capacity between sensor and display unit, the measuring accuracy in particular of the electric field is improved.

With the method according to the present invention, electric and magnetic fields may be measured simultaneously. Preferably, the person taking the measurement holds the measuring device in his/her hand when measuring electric fields, in particular three-dimensional electric fields. More preferably, for measuring electric and/or magnetic fields the device is kept at a distance from the body of the person taking the measurement by means of a short handle, such as a rod. It is an advantage of the device and the method according to the invention that the person taking the measurement may move with the device within a room or in the open and that accurate measurements are even possible if there are highly static fields of several kV/m of the electric field. Preferably, the sensor is moved steadily and uniformly so that static fields so not affect the measurement.

BRIEF DESCRIPTION OF THE DRAWINGS

The invention will be illustrated by means of working examples in the drawings, which.

DETAILED DESCRIPTION OF THE PREFERRED EMBODIMENTS

Figure 1:
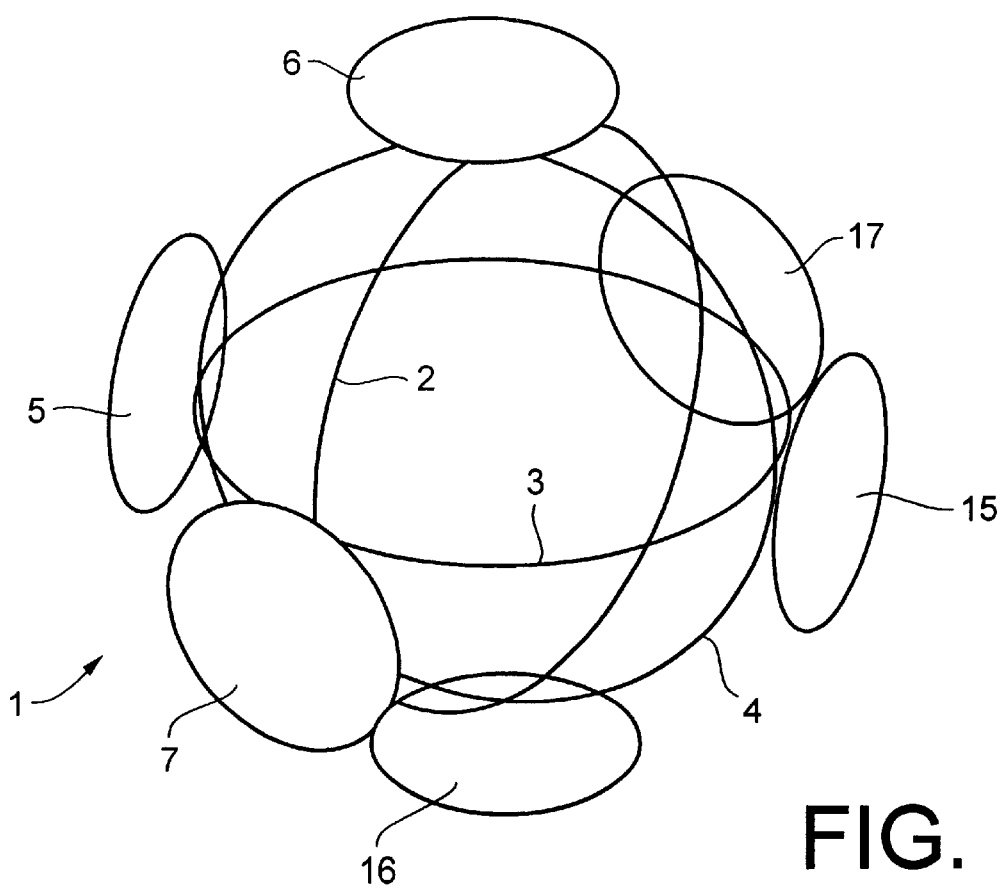
FIG. 1 shows a schematic view of a three-dimensional field sensor comprising three coils and six capacitor plates.

Reference sign 1 in FIG. 1 designates a field sensor comprising three intermeshing annular coils 2, 3 and 4. Coil 2 is perpendicular to the x-axis, coil 3 is perpendicular to the y-axis and coil 4 is perpendicular to the z-axis. Outside the spherical structure formed by the three coils, there are six capacitor plates 5, 15; 6, 16 and 7, 17, every two of which are arranged in parallel and form a capacitor. The capacitor plates 5, 15 are in this connection perpendicular to the x-axis, the capacitor plates 6, 16 are perpendicular to the y-axis and the capacitor plates 7, 17 are perpendicular to the z-axis.

The three coils 2, 3, 4 serve for measuring a magnetic field three-dimensionally, whereas the three capacitors 5, 15; 6, 16 and 7, 17 serve for measuring the electric field.

Figure 2:
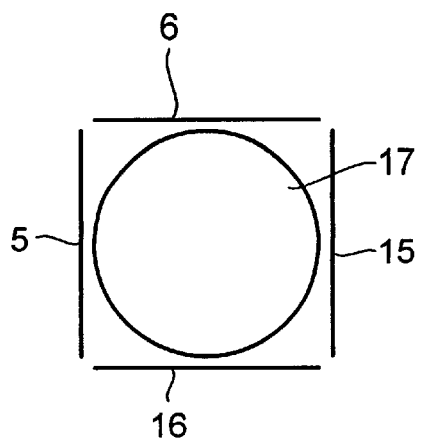
FIG. 2 shows a schematic arrangement of six capacitor plates.

The capacitor plates are advantgeously so big that they form an almost closed cube, as depicted in FIG. 2. The capacitor plates have a circular shape and completely cover the coils 2, 3, 4 inside.

Figure 3:
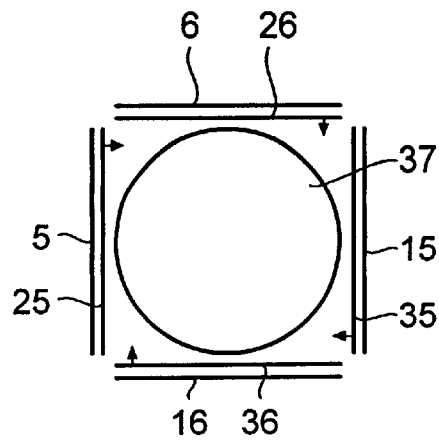
FIG. 3 shows an arrangement of twelve capacitor plates.

In the embodiment according to FIG. 3, pairs of superimposed capacitor plates 5, 25; 6, 26; 7, 27; 15, 35; 16, 36; 17, 37 are provided which have a small distance from each other. In each case, the respective inner plate 25, 26, 27, 35, 36, 37 is connected to the common earth. Both the earth terminals and the terminals of the other plates are at the outer edge of the plates in order to avoid interference on account of the current within the lines.

The surfaces of the capacitor plates have a high-resistance coating. The plates may, however, also be made of a material having a high-resistance surface.

Figure 4:
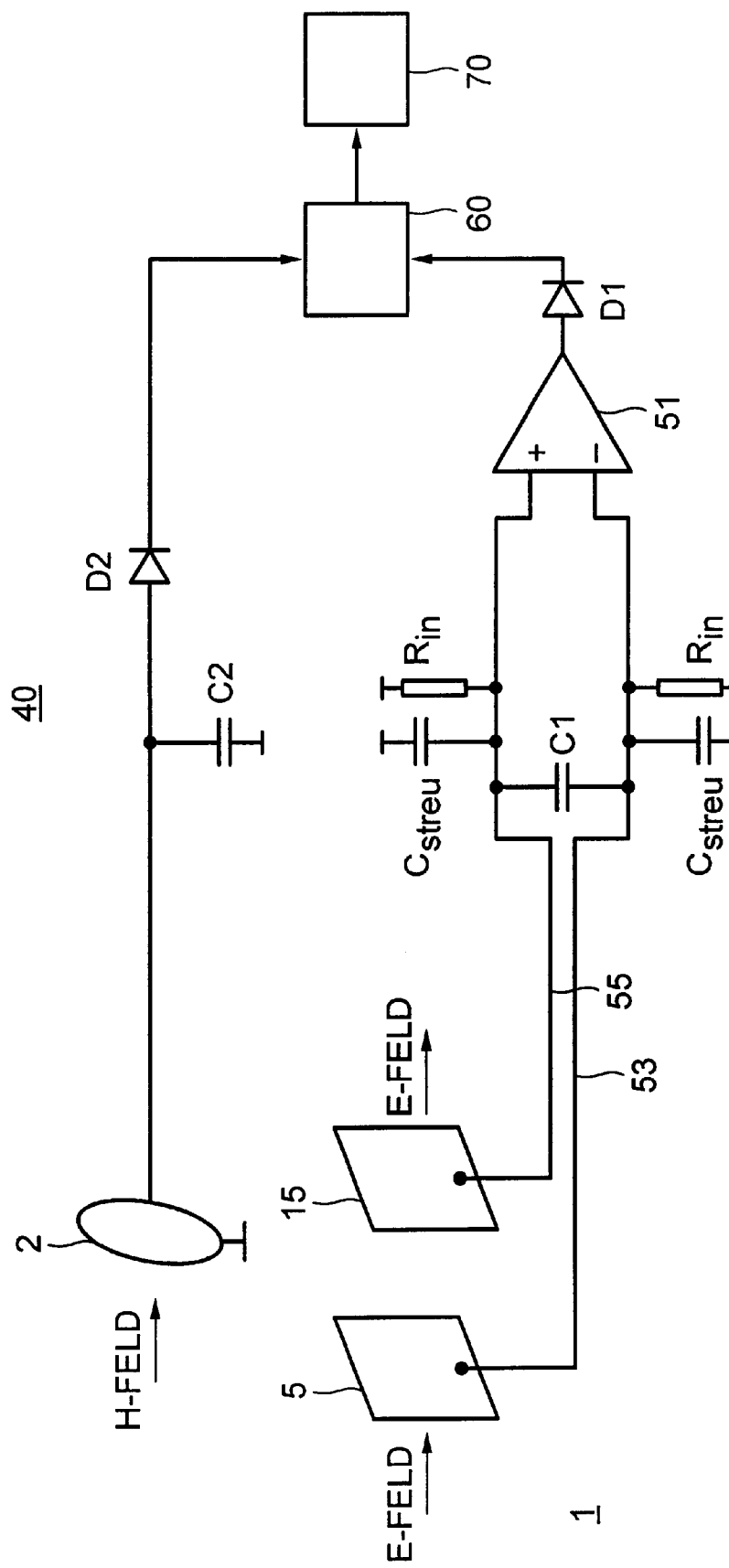
FIG. 4 shows a block diagram of a device for measuring electric and/or magnetic fields.

FIG. 4 shows a preferred embodiment of a device for measuring electric and magnetic fields as a basic circuit. It schematically shows a capacitor-plate couple 5, 15 for unidimensionally measuring an electric field (E-field) and a coil 2 for unidimensionally measuring a magnetic field (H-field).

The device 50 for measuring an electric field comprises a differential amplifier 51 whose non-inverting input is connected to the capacitor plate 15 and whose inverting input is connected to the capacitor plate 5. A capacitor C1 is connected between the input terminals of the differential amplifier. The capacitor-plate couple 5, 15 and the measuring device 50 are connected via thin wires 53, 55, which are preferably twisted with each other. Both input terminals of the differential amplifier 51 have a low input stray capacity (Cstray), which is preferably in a range between 0.5 pF and 1 $\mu$F with respect to earth. The input resistance of both inputs Rin is connected to earth with a high resistance; the resistance ranges preferably from 1 M$\Omega$ to 100 T$\Omega$. The capacity of the capacitor C1 ranges preferably from 0.5 pF to 10 $\mu$F. Preferably, the capacity may be switched from for example 1 nF to 10 nF while the sensitivity is changed for different measuring ranges. The output signal of the differential amplifier 51 is rectified by a rectifier D1 and supplied to an evaluation unit 60.

In the depicted example, the capacitor plates are square and preferably have an edge length of 5 mm to 300 mm. The distance between the capacitor plates approximately corresponds to the edge length of the capacitor plates. The distance between the field sensor 1 and the measuring device is preferably 5 mm to 1000 mm.

When a field sensor as depicted in FIGS. 1 to 3 is used, each capacitor-plate couple is connected with a respective measuring device 50. Thus, the simultaneous three-dimensional detection of the electric field is possible.

In the shown example, the capacitor plates consist of a high-resistance material, such as printed circuit material, FR4, Pertinax or the like. Each of the capacitor plates facing the outside is provided with a conductive layer, such as a graphite layer. The wires are connected with the respective capacitor plates by means of a conductive lacquer/varnish.

In an alternative embodiment (not shown), a cube of plastics is injection-moulded. Each of the 6 surfaces forms a capacitor plate. This injection-moulded cube is hollow and for example forms a box with a hinged lid. An arrangement of three perpendicular coils 2, 3 and 4 (cf. FIGS. 1, 2 and 3) is inserted into this box. Preferably, the coils are fixed to the capacitor plates by gluing.

FIG. 4 further shows a basic circuit of a device for measuring the magnetic field comprising an integrator 40 connected with a coil 2. The integrator 40 consists in the shown embodiment of a capacitor C2 which is connected to earth and a diode D2, which are both connected with one end of the coil 2. The other end of the coil 2 is earthed. In the shown example, the coil has an annular or cylindrical winding of wires and the number of windings is between 1 to 50,000. In the shown example, the coil has a diameter of approximately 30 mm corresponding to the preferred edge length of the capacitor plates 5, 15.

The measuring device further comprises an evaluation means 60 to which the output signal of the differential amplifier 51 and the output signal of the integrator 40 is applied. The output signals are processed by the evaluation means 60 and outputted to a display 70 in a scaled form. The display preferably comprises a bar chart display and additionally outputs a digital numerical value. The display further comprises an add-on acoustic display which preferably changes frequency and/or volume as a function of the signal strength and converts a start value and an end value into a corresponding tone. Simultaneously, a parallel evaluation of the two measuring values is carried out.

If an electric field is three-dimensionally measured, the signals of the three capacitor-plate couples 5, 15; 6, 16 and 7, 17 are collected by three measuring devices 50 and the signals of the coils 2, 3, 4 are collected by three measuring devices 40 and applied to the evaluation means 60. The evaluation means comprises analog-to-digital converters and a microprocessor which further processes the digital signals. Preferably, the output signals are squared, subsequently the squares are added and the square root of the sum is calculated. Moreover, scaling is accomplished. The result thus gained is supplied to the display 70.

Furthermore, the measuring unit may be floatingly connected to a distant evaluation unit via optical waveguides and is preferably remotely controllable. Thus, a completely floating measurement is in particular achieved and measurements in highly electric or magnetic fields are made possible without exposing the person taking the measurements to these fields.

What is claimed is:

1. A field sensor comprising:
   a magnetic field sensor, and an electric field sensor;
   wherein said electric field sensor includes at least six capacitor plates being arranged so that each of said at least six plates forms part of a different face of a cube, and wherein said magnetic field sensor is located in the space surrounded by the faces of the cube.

2. The field sensor according to claim 1, wherein said magnetic field sensor comprises at least three annular or cylindrical coils arranged perpendicularly to each other.

3. The field sensor according to claim 2, wherein said coils are annularly fitted into each other with an almost identical diameter.

4. The field sensor according to claim 2, wherein each said coil has an axis parallel to two of said plates.

5. The device according to claim 2, wherein said at least three coils are connected by gluing and wherein each of said plates is connected with one of said coils by gluing.

6. The device according to claim 2, wherein the space in the coil area and in the area between the capacitor plates is at least partially filled up with a plastics foam.

7. The field sensor according to claim 1, wherein said magnetic field sensor is one of coils, Hall-effect sensors, and magnetoresistors.

8. The field sensor according to claim 7, wherein each of said plates is provided with a high-resistance coating.

9. The field sensor according to claim 7, wherein each of said plates comprises a high-resistance material.

10. The field sensor according to claim 7, wherein each of said plates forms a pair with an associated plate different than others of said at least six plates, and wherein the inner plate of a pair is electrically connected to a common ground terminal.

11. The field sensor according to claim 7, wherein electric lines connected to said plates are provided at their edges.

12. The device according to claim 7, wherein said plates are arranged such that each two facing plates are parallel and have the same size.

13. The device according to claim 12, wherein said plates are square and have an edge length in the range of 5 mm to 300 mm.

14. The device according to claim 13, wherein the distance between two facing plates is substantially identical with the edge length of the said two facing plates.

15. The device according to claim 1, wherein said plates are formed of a plastic material, each said plate having a conductive layer on a side facing away from the opposing plate.

16. The device according to claim 15, wherein said plates comprise a printed circuit material being one of FR4 or Pertinax.

17. The device according to claim 15, wherein said conductive layer is a graphite layer.

18. The device according to claim 1, wherein said cube comprises plastics.

19. The device according to claim 18, wherein said cube is hollow and forms a box with a lid, which is hingedly arranged at a cube edge.

20. A method for measuring the electric fields comprising the step of using the device of claim 1, characterized by slow and calm movements of the device, wherein measuring errors are minimized by static continuous fields which are otherwise detected as alternating fields due to movements of the device.

21. A method of measuring electric and/or magnetic fields comprising the step of using the device according to claim 1.

22. The method according to claim 21, wherein the device is handheld.

23. The method according to claim 21, wherein the device is handheld using a short handle.

24. A device comprising:
   a) an electric field sensor comprising at least one pair of capacitor plates, each plate of said pair being positioned on an opposing face of a cube,
   b) a differential amplifier having a non-inverting input and an inverting input, wherein one of said pair of plates is connected with the non-inverting input and the other of said pair of plates is connected with the inverting input, and
   c) a connecting capacitor having one terminal connected to the inverting input and another input connected to the non-inverting input.

25. The device according to claim 24, further comprising two small input capacitors each insulating said one input of said differential amplifier from ground.

26. The device according to claim 25, wherein said input capacitors are between 0.5 pF and 1 $\mu$F.

27. The device according to claim 25, wherein said input capacitors are nearly identical.

28. The device according to claim 24, wherein said non-inverting input and said inverting input of the differential amplifier are connected via a high-ohmic resistance to ground.

29. The device according to claim 28, wherein the resistance to ground is in the range of 1 MΩ to 100 TΩ.

30. The device according to claim 24, wherein said connecting capacitor has a value in the range of 0.5 pF to 10 μF.

31. The device according to claim 30, wherein the connecting capacitor is switchable between the two values of 180 pF and 1.8 nF.

32. The device according to claim 24, wherein said at least one pair o plates is connected with said differential amplifier via a pair of thin wires which are twisted around each other.

33. The device according to claim 32, wherein each wire of said pair of thin wires is contacted with a plate comprising a conductive laquer/varnish in the area of an edge.

34. The device according to claim 24, wherein the distance between said field sensor and said differential amplifier is in the range of 5 mm to 1000 mm.

35. The device according to claim 24, wherein the surface of the differential amplifier and/or said connecting capacitor is smaller than the surface of said pair of plates.

36. The device according to claim 24, wherein said field sensor further includes at least two pairs of capacitor plates, in addition to said at least one pair of plates, each one of said three pairs of parallel plates being perpendicular to the other two of said three pairs of plates.

37. The device according to claim 36, wherein all of said plates are square and the distance between said pairs of plates is in the range of 0.1 mm/to 50 mm.

38. The device according to claim 37, wherein the distance between said pairs of plates is about 1 mm.

39. The device according to claim 24, further comprising at least a coil and at least one integrator connected to said coil.

40. The device according to claim 39, wherein said integrator comprises a second capacitor and a rectifier, wherein one terminal of said second capacitor is connected to a terminal of said coil and the other terminal of said second capacitor is connected to ground, the terminal of said second capacitor being connected to said coil being connected to said rectifier.

41. The device according to claim 24, further comprising at least one of a measuring device and an integrator, an evaluator, and a display device being an optical or an acoustic display.

42. The device according to claim 41, further comprises at least one magnetic field sensor comprising a coil, wherein said evaluator uses a signal from said electric field sensor or said magnetic field sensor to provide an estimate of sensed field to said display device.

* * * * *